United States Patent [19]

Patterson et al.

[11] Patent Number: 4,972,247

[45] Date of Patent: Nov. 20, 1990

[54] HIGH ENERGY EVENT PROTECTION FOR SEMICONDUCTOR DEVICES

[75] Inventors: Joseph M. Patterson, Mission Viejo; Daniel T. Hwang, Fullerton, both of Calif.

[73] Assignee: Silicon Systems, Inc., Tustin, Calif.

[21] Appl. No.: 142,269

[22] Filed: Jan. 11, 1988

Related U.S. Application Data

[63] Continuation of Ser. No. 791,729, Oct. 28, 1985.

[51] Int. Cl.$^5$ .............................................. H01L 29/72
[52] U.S. Cl. ......................................... 357/34; 357/13; 357/15; 357/48; 357/86
[58] Field of Search ........................ 357/13, 15, 48, 34, 357/86

[56] References Cited

U.S. PATENT DOCUMENTS

| | | | |
|---|---|---|---|
| 4,400,711 | 8/1983 | Avery | 357/48 |
| 4,564,855 | 1/1986 | Van Zanten | 357/48 |
| 4,692,991 | 9/1987 | Flowers | 357/15 |

Primary Examiner—Edward J. Wojciechowicz
Attorney, Agent, or Firm—Hecker and Harriman

[57] ABSTRACT

A circuit configuration which provides protection against damage to semiconductor devices, such as integrated circuits or discrete components caused by high energy events. An additional base region is formed in the epitaxial layer collector of a bipolar transistor. The added base region overlaps an isolation region having an opposite conductivity to the epitaxial layer. During a high energy event, the reverse breakdown of the junction formed between the added base region and the epitaxial layer is in parallel with the reverse breakdown of the junction formed between the epitaxial layer and the substrate. The breakdown voltage of the junction formed at the added base region is less than that of the epitaxial layer/substrate breakdown so that less power is dissipated as heat in the silicon. As a result, the likelihood of thermal damage to PN/junctions near silicon-aluminum contacts is reduced.

9 Claims, 6 Drawing Sheets

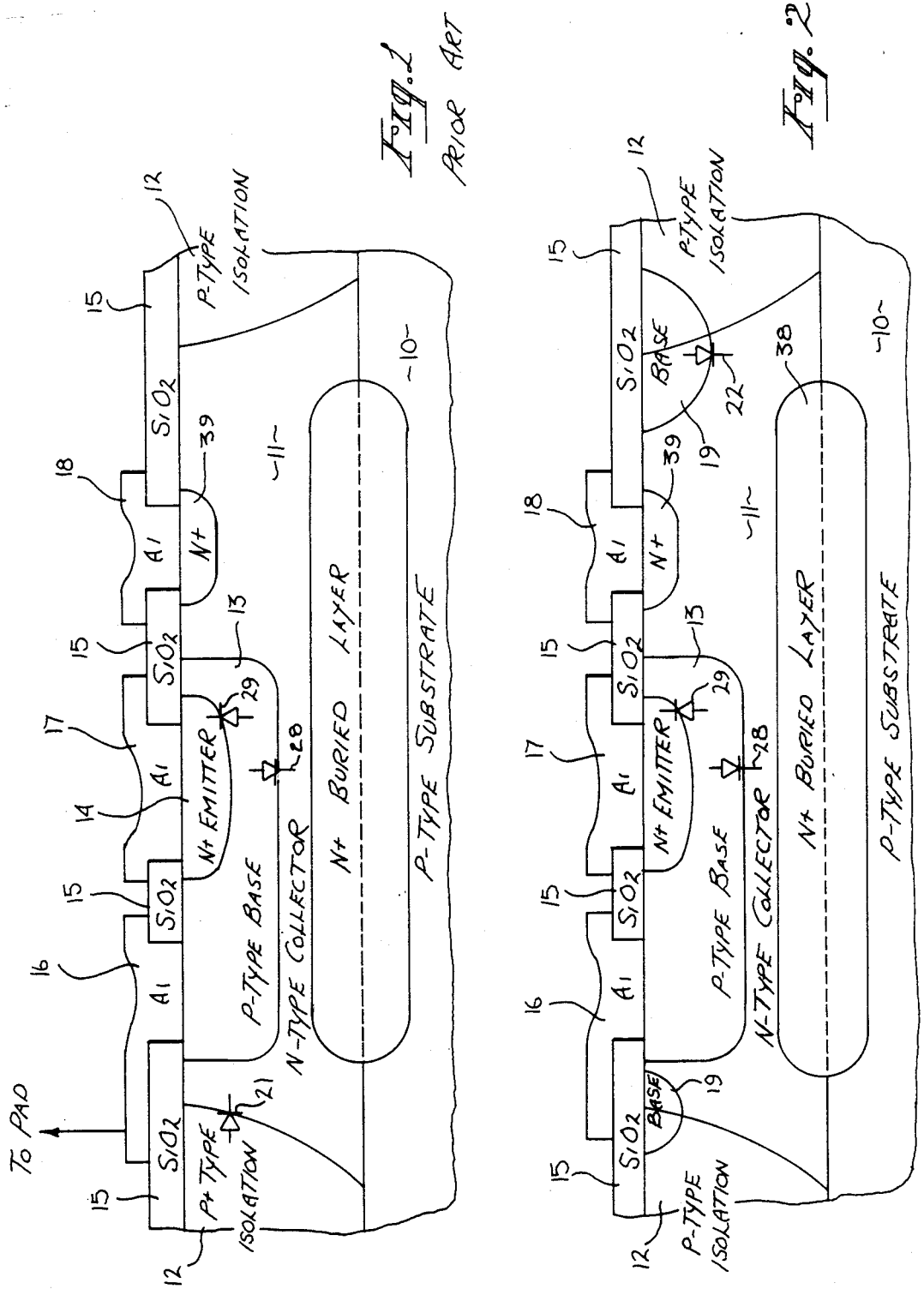

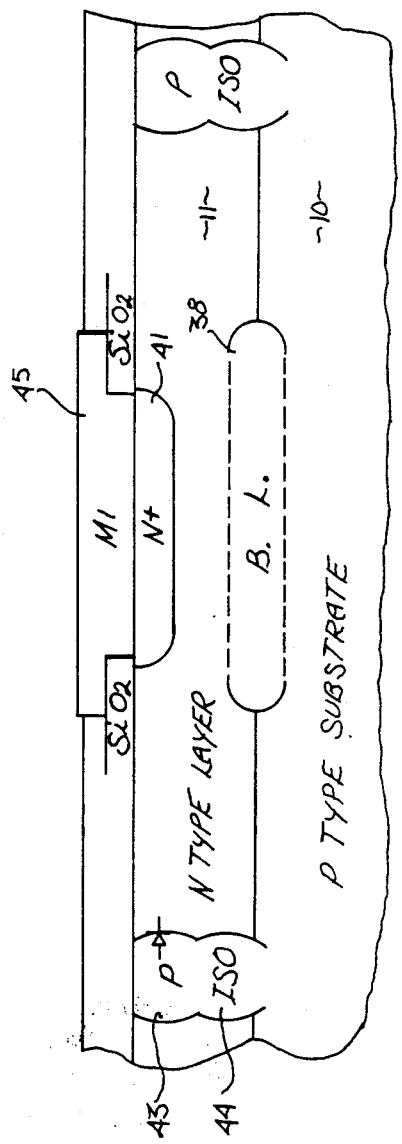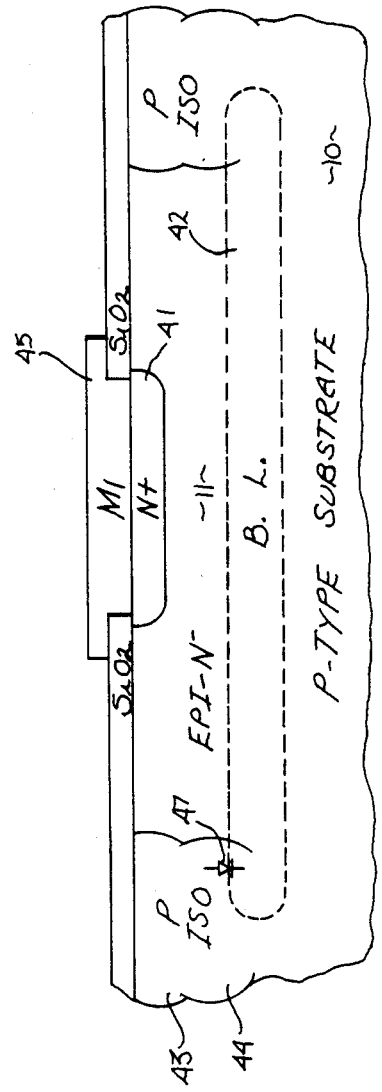

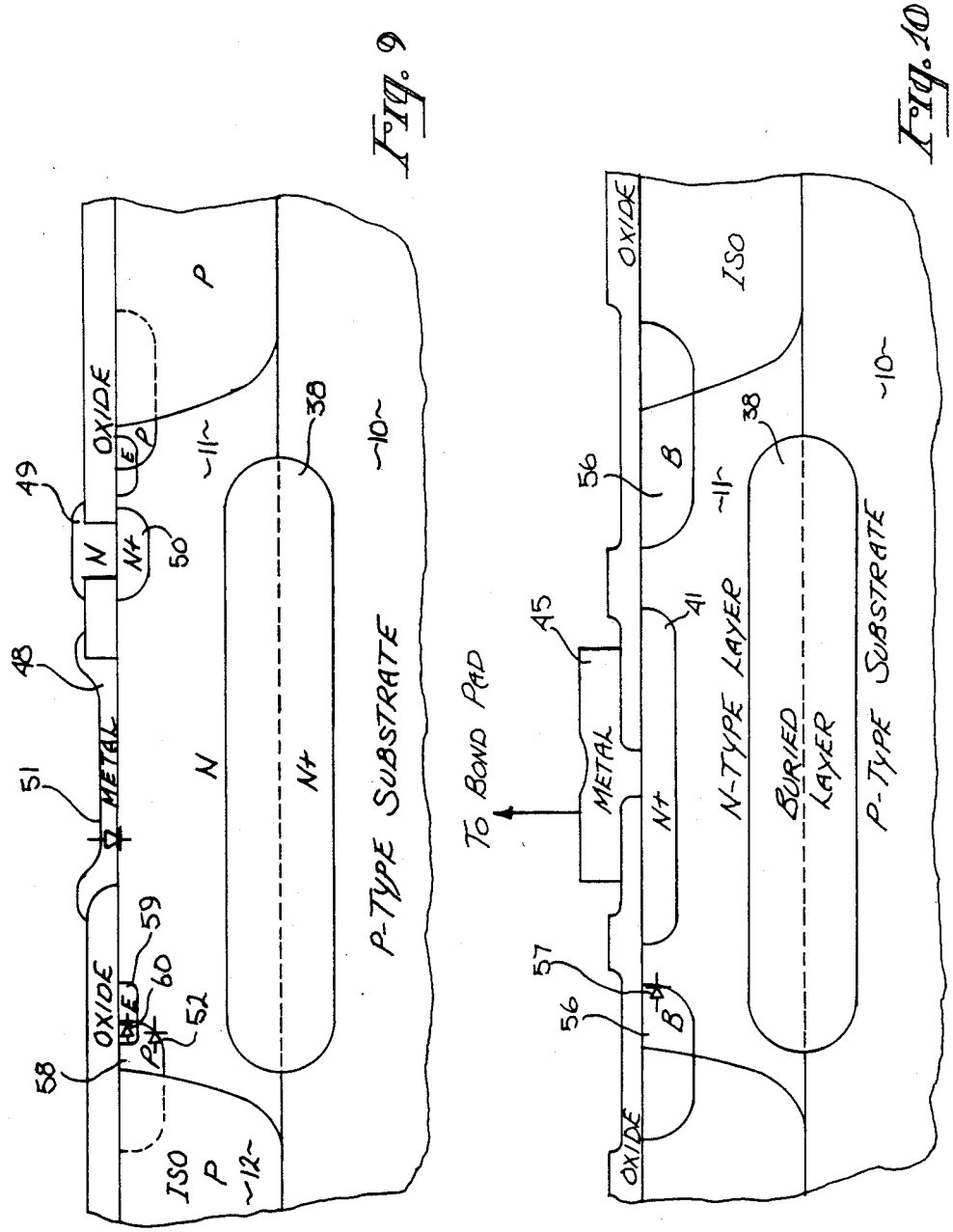

HIGH ENERGY EVENT PROTECTION FOR SEMICONDUCTOR DEVICES

BACKGROUND OF THE INVENTION

This is a continuation of application Ser. No. 791,729, filed Oct. 28,1985.

1. Field of the Invention

This invention relates to the field of protection schemes to protect against damage to semiconductor devices, such as integrated circuits or discrete components, caused by high energy events, including transient events of sufficient energy, such as electrostatic discharge or undesireable transients.

2. Prior Art

Semiconductor devices are often subjected to high energy events, excess voltage or current, which can damage such devices. For example, during handling, integrated circuit packages often build up large static charges or receive charges from the environment (such as people). These charges can reach levels as high as 10–20 K volts and can result in a high energy event resulting from its discharge known as electrostatic discharge "(ESD)". The large voltages generated during ESD can severely damage an integrated circuit embodied in a chip package. Even discharges as low as 250 volts can damage devices.

Typically, most of the power generated by the ESD high energy event is dissipated by semiconductor devices associated with bond pads connected to the leads of the chip package. The voltages involved in an ESD exceed the breakdown voltages of these devices. During the ESD event these devices nearest to the package leads break down and dissipate the ESD power as heat which is transferred to the surrounding region of that component. This heat often exceeds the aluminum-silicon eutectic temperature causing failure of the junctions nearest the contacts which are part of these devices. Alternately, a high voltage transient can cause dielectric breakdown of thin insulation layers.

Other high energy events, such as voltage or current spikes (usually of short duration), can also severly damage or destroy semiconductor devices.

Various attempts have been made in prior art to protect against such high energy events. For Example, Carinalli, U.S. Pat. No. 4,291,319 discloses a protective transistor coupled to the base and collector of a switching transistor to protect it against surges generated by an inductive load coupled to the transistor. The protective transistor is designed to have a lower breakdown voltage than the switching transistor so that upon breakdown, it pulls the base of the switching transistor toward that breakdown voltage, which is below the breakdown voltage of the switching transistor. As a result, the switching transistor is turned on, enabling it to dissipate the surge energy. The protection device of Carinalli suffers the drawback of requiring that the protected device participate in the power dissipation. This places the dissipation energy near metal silicon contact points, increasing the chance of failure.

Olmstead, U.S. Pat. No. 3,936,863, discloses a power transistor having a ballasting resistance to reduce the possibility of breakdown, and a voltage control diode between the collector and emitter. While Olmstead provides protection against breakdown during high reverse bias voltages, it incorporates metal contacts into the voltage control diode, which increases the likelihood of contact melting and junction damage.

Kannam, U.S. Pat. No. 4,017,882, discloses a method of providing reverse bias breakdown protection for bipolar transistors. Kannam includes a diode in parallel with the base-emitter pn junction. However, the protective diode of Kannam is disposed within the core of the collector ring which surrounds the perimeter of the protected transistor base. Additionally, the diode is coupled to the emitter ring through metal contacts. Thus, this device has the disadvantage of being in close proximity to the active device, and to metal contacts that are subject to thermal degradation.

SUMMARY OF THE PRESENT INVENTION

The present invention provides protection against high energy events such as electrostatic discharge and voltage/current transients for junction devices such as, for example, bipolar transistors, MOS transistors, resistors, Schottky diodes, p-n junction diodes, and source/-drain of MOS transistor junctions. A bipolar transistor is formed in an n-well epitaxial layer on a p-type substrate and surrounded by a p-type isolation ring. A base region, formed at the same time as the base region of the bipolar transistor, is formed overlapping the epitaxial layer and the isolation region. This extra base region forms a diode in parallel with the isolation to collector junction of the protected device. By overlapping the p-type isolation region with a base diffusion, no metal contact to the extra base region is required. The breakdown voltage of the protecting diode is less than or equal to that of the protected device. As a result, the power from high energy events is dissipated away from the protected device and away from metal silicon contact points. Additionally, because the protection device for the present invention does not require a metal contact on the isolation side, less silicon area is required to implement the device.

BRIEF DESCRIPTION OF THE DRAWINGS

FIG. 1 is a cross sectional view of an alternate semiconductor substrate with a bipolar transistor formed thereon.

FIG. 2 illustrates the device of FIG. 1 with an additional base region formed therewith.

FIG. 6 is a cross sectional view of a prior art protection device.

FIG. 7 is a cross sectional view of a semiconductor substrate with a third alternate embodiment of the present invention formed therein.

FIG. 9 illustrates the embodiment of FIG. 8 with an emitter region formed therein.

FIG. 10 illustrates a fourth alternate embodiment of the present invention.

DETAILED DESCRIPTION OF THE PRESENT INVENTION

Figure 3:
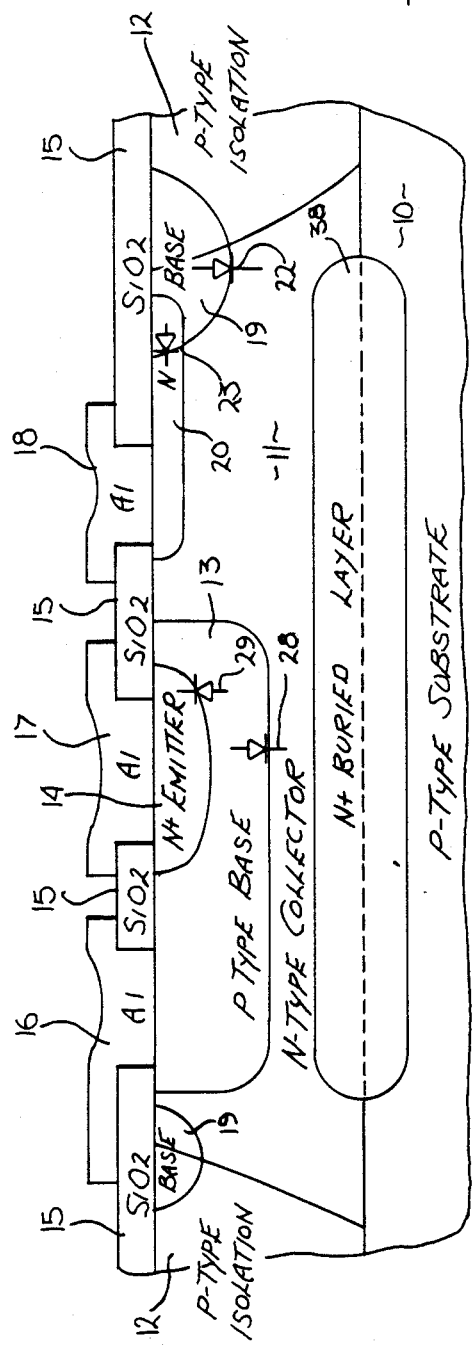
FIG. 3 illustrates the device of FIG. 2 with an added emitter region formed therewith.

A protection device which provides protection against high energy events in semiconductor devices is described. In the following description, numerous specific details are set forth, such as breakdown voltages, conductivity types, etc., in order to provide a more thorough understanding of the present invention. It will be obvious, however, to one skilled in the art, that the present invention may be practiced without these specific details. In other instances, well-known features have not been described in detail in order not to unnecessarily obscure the present invention.

FIG. 1 illustrates a prior art bipolar transistor formed on a p-type semiconductor substrate 10 that does not incorporate the present inventive protective device. An n-type epitaxial layer 11 is formed in the substrate layer and serves as the collector for the transistor. This n-type region may also be formed as a diffused or implanted layer. A p+ type isolation region 12 surrounds the epitaxial layer. A buried n+ layer 38 is formed at the collector substrate junction. A p-type base region is formed in the collector tub 11 and aluminum contact 16 is provided. The base region 13 may be formed by diffusion or ion implantation. Doping with an impurity of opposite conductivity type is done to form the n-plus emitter region 14. Contacts 17 and 18 provide electrical connection to the emitter 14 and the collector 11. (The latter through n+ region 39). SiO2 regions 15 provide insulation for the contacts. Aluminum contact 16 couples the bipolar transistor to the input-output pad of the integrated circuit so that this transistor constitutes the first input transistor stage of the circuit. Although shown with a base coupled to the bonding pad, the bonding pad connection could alternatively be from collector contact 18, or emitter contact 17.

The pn junctions formed in the semiconductor substrate at 10 act as diodes. Diode 28 is formed at the junction between the p-type base region 13 and the n-type collector region 11. Diode 29 is formed at the pn junction between the base region 13 and the emitter region 14. Diodes 28 and 29 are forward biased during a high energy event. Diode 21 is formed at the junction between the collector region 11 and the p-type isolation region 12. Diode 21 is reversed biased during positive high energy events.

Still referring to FIG. 1, during a high energy event, the current path for the surge voltage is from collector 11 to the isolation region 12. As a result, most of the surge power is dissipated by diode 21 at the collector tub/isolation region junction. The heat generated during power dissipation is transferred to the surrounding silicon to the nearest contact window. If the resulting peak temperature in the silicon heat transfer area exceeds the aluminum-silicon eutectic temperature, the aluminum melts and permanent damage to nearby junctions will result.

The voltage from the high energy event exceeds the reverse breakdown voltage of the collector to isolation junction, causing avalanche breakdown at a high voltage. To prevent this avalanche effect occuring at a high voltage, the present invention incorporates a base region away from the transistor and in the collector tub 11. This base region 19 is shown in FIG. 2 extending into the isolation region 12. By forming this region overlapping the isolation region, no metal contact to the added base is required, because the isolation region 12 is coupled to a voltage reference, or to ground. The base region 19 acts as a diode 22 with the collector region 11. This diode 22 is in parallel with the collector to isolation junction. An electrostatic discharge which reverse biases diode 21 will also reverse bias the protecting diode 22. Diode 22 has a reverse breakdown voltage in the range of 20 to 30 volts, which is lower than the reverse breakdown voltage of diode 21. Because the power dissipated is proportional to the square of the voltage, the power dissipated by diode 22 is substantially less than would be dissipated by diode 21, reducing the heat spreading through the surrounding silicon and the protecting junction near the contact points. Additionally, the region where power will be dissipated can be selected to provide maximum protection or isolation of the aluminum contact points from areas that are heated during a high energy event. For example, the protecting structure can be incorporated across the input or output to power supply pins. This provides maximum protection for the first transistor stage of the circuit. Further, because the protecting diode does not have a metal contact, but rather overlaps the isolation region 12, no contacts are exposed to the power dissipated at the protecting diode 22.

An alternate embodiment of the present invention is shown in FIG. 3. In addition to the added base region 19, an added emitter region 20 is formed in the collector region 11. This added emitter region 20 also overlaps the added base region 19. Emitter region 20 forms a diode 23 with the added base region 19. The emitter region 20 is formed such that the diode 23 has a reverse breakdown voltage in the range of approximately 5 to 7 volts. The emitter region 20 is formed at the same time as the transistor emitter region 14. Likewise, the base region 19 is formed at the same time as the transistor base region 13. As a result, no additional processing steps are required to manufacture the ESD protection structure. Thus, the ESD protection device does not add manufacturing complexity or difficulty in processing. Further, because metal contacts are not employed, a minimum of silicon area is required for this purpose.

The embodiment of the present invention as illustrated in FIG. 3 is best employed when the operating voltage of the circuit does not exceed the emitter-base breakdown. If higher operating voltages are employed, greater than the emitter-base breakdown, the use of the added emitter region 20 will be precluded, because normal operating voltages will be shunted by the breakdown of diode 23. In that case, the embodiments illustrated in FIGS. 2, 5, 7 and 8 are preferred.

The present scheme for protection against high energy events allows for clamping of the epitaxial layer 11 to the isolation region 12 without aluminum-silicon contacts. In addition, alternate embodiments of the present invention illustrated in FIGS. 4 and 5 allow clamping of the epitaxial layer 11 to the base region 13, or resistor clamping, without using aluminum-silicon contacts on at least one protecting diode.

Figure 4:
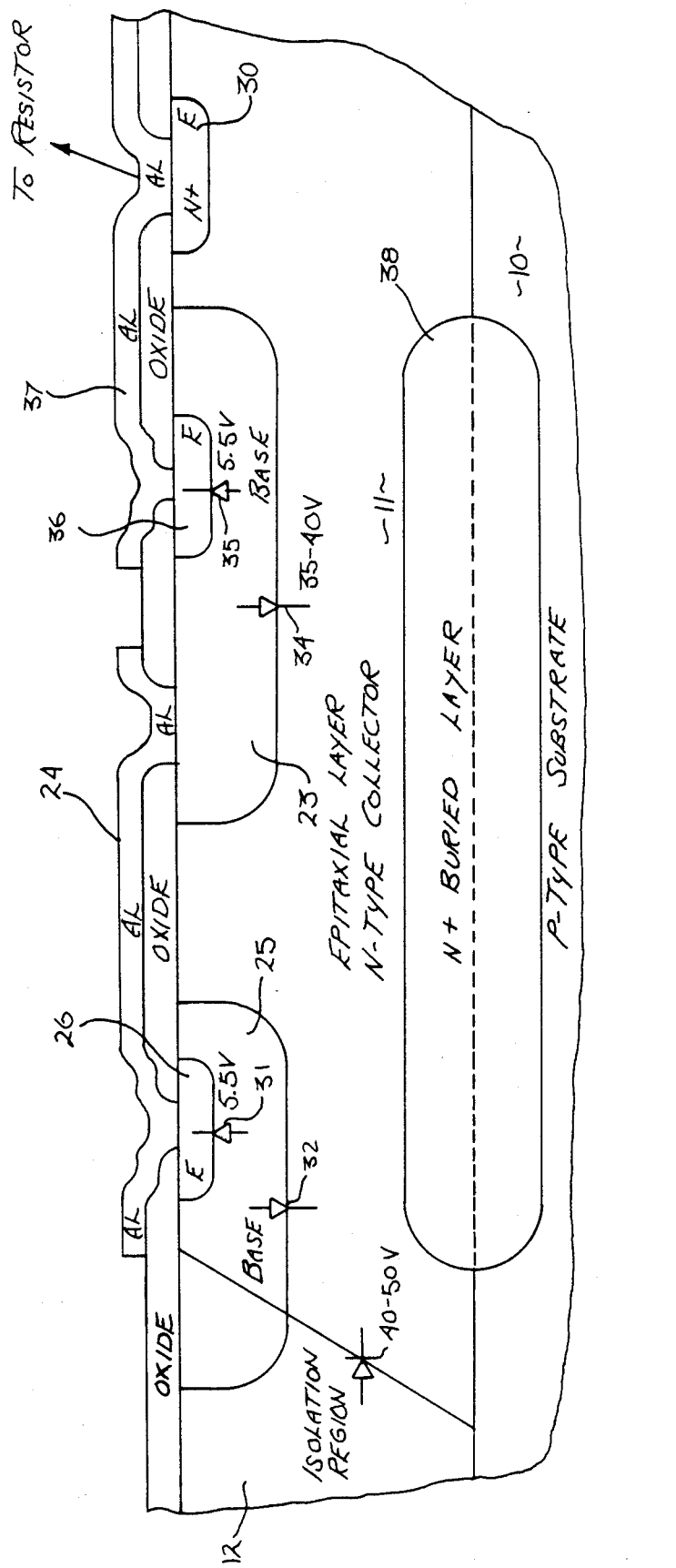
FIG. 4 is a cross sectional view of a semiconductor substrate utilizing an alternate embodiment of the present invention.

FIG. 4 illustrates one such method of high energy events protection. Base regions 25 and 23 are formed in a collector with base 25 extending into the isolation region 12. In a subsequent step, emitter region 26 is formed completely within base region 25 and emitter region 36 is formed completely within base region 23. Also in that step, a third emitter region 30 is formed in the epitaxial layer and separate from either base region. Aluminum layer 37 connects epitaxial layer 26 with base 23 while aluminum layer 37 couples emitter region 36 with emitter region 30. Diode 31 is formed at the junction of emitter region 26 and base region 25. Diode 32 is formed at the pn junction between base region 25 and collector 11. Diodes 35 and 34 are formed at the junctions between the base region 23 and the emitter region 36 and collector 11 respectively. In this configuration, a metal contact to the collector 11 through emitter region 30 is employed.

Figure 5:
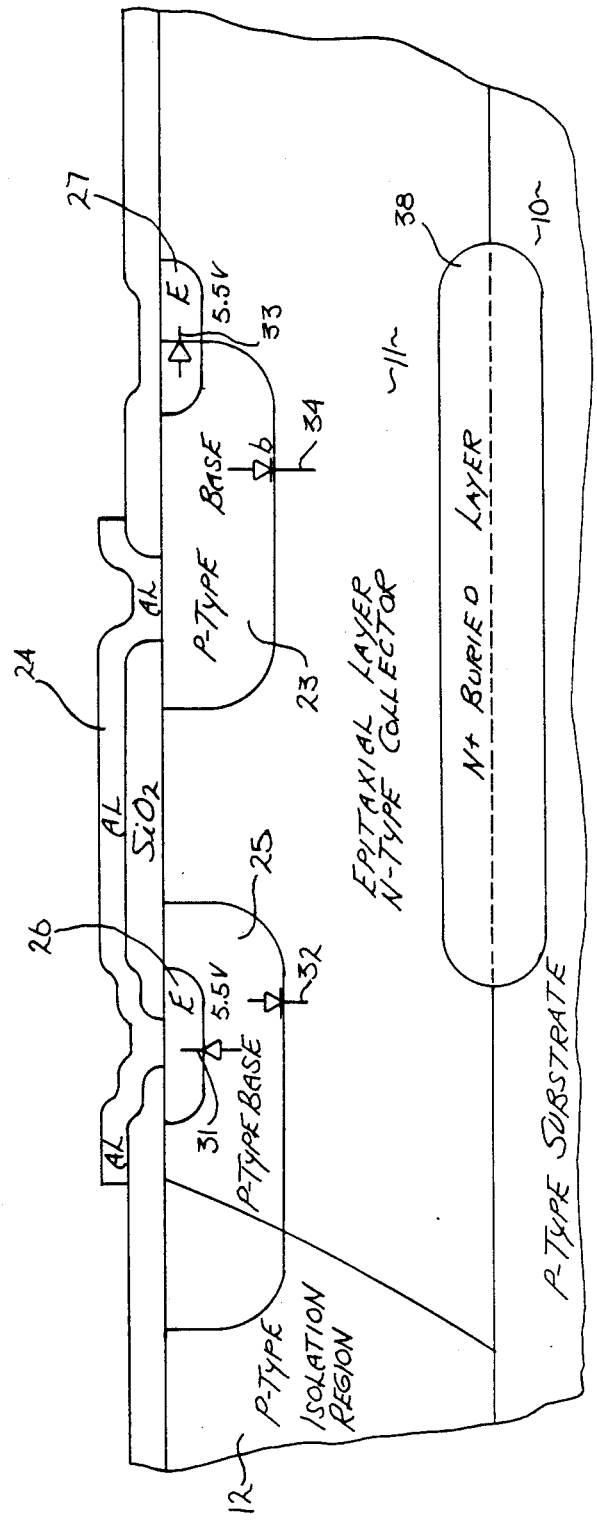
FIG. 5 is a cross sectional view of a semiconductor substrate with a second alternate embodiment of the present protection device of the present circuit formed therein.

FIG. 5 illustrates an alternate embodiment of the present invention which eliminates the metal contact of FIG. 4. Base regions 23 and 25 may be formed in a single step, with base region 25 extending into isolation region 12. In a subsequent processing step, emitter region 26 is formed in base region 25 and emitter 27 is formed overlapping base region 23 and collector region 11. An aluminum contact 24 couples emitter region 26 to base region 23. Diode 31 is formed at the junction between emitter region 26 and base region 25. Diode 32 is formed at the pn junction between base region 25 and collector region 11. Diodes 33 and 34 are formed at the junctions between the base region 23 and the emitter region 27 and epitaxial layer 11 respectively.

The embodiment illustrated in FIG. 5 provides high energy event protection for the epitaxial layer. When a high energy event occurs in the epitaxial layer, the voltage path is through the reverse bias of diode 33 to base 23 through aluminum conducting path 24 to emitter 26 and through the reverse bias of diode 31 into base region 25. Diodes 33 and 31 are in series and each have a reverse breakdown of approximately 5-7 volts so that net reverse breakdown voltage of the present embodiment is approximately 10 to 14 volts. This configuration is particularly applicable when operating voltages greater than the emitter base breakdown voltage are used and silicon area is to be conserved. By utilizing the emitter-base diodes 33 and 31 of FIG. 5 in series, one aluminum contact can be utilized (at emitter region 26) without fear of thermal degradation and without a silicon area penalty. This is due to the fact that the power dissipated by diodes 31 and 33 is much lower than the power dissipated by a base region alone.

The configuration illustrated in FIG. 4 operates during a high energy event exactly like the configuration shown in FIG. 5 with diodes 31 and 35 in series providing reverse breakdown in the 11 to 12 volt range. In the configuration of FIG. 4, metal contacts are used to couple the epitaxial layer through emitter region 30 to emitter region 36.

A prior art scheme for protecting services devices from high energy events is shown in FIG. 6. A protecting diode is formed in between bonding pads of an integrated circuit. As shown in FIG. 6, an n-type epitaxial layer 11 is formed on a p-type substrate 10. N+ buried layer 38 is formed at the collector/substrate junction. N+ region 41 provides contact to the collector region 11 and through metal layer 45 to a bonding pad. In this prior art method, a lightly doped isolation region 44 is formed extending from the substrate partially through the collector region. An added p-type base region 43, more heavily doped than the isolation region 44, is then formed above the isolation region. During a high energy event, power is dissipated through the diode 46 formed at the collector/base junction. The reverse breakdown of this junction is typically 30 to 40 volts. The collector/base junction must be sufficiently removed from the metal contact 45 to avoid thermal degradation of the contact during a high energy event.

Improved protection can be provided by implementing the embodiment shown in FIG. 7 which is particularly suited for up and down isolation/base processes. In this embodiment, the buried layer 42 extends into the isolation region 44. The diode 47 formed at this junction has a reverse breakdown in the 10–20 volt range. In addition to dissipating a lower amount of power, the power dissipation is located in the bulk of the silicon, at the buried layer/isolation substrate, further reducing the likelihood of thermal degradation of the metal contact.

When the up and down base/isolation diffusion configuration is not utilized, an overlapping base region as previously described can be used to replace the extended buried layer. As shown in FIG. 10, the diodes formed between the bond pads can be formed having an isolation region 55 extending from the substrate and through the collector region. In this situation, an added base region 56 overlaps the isolation region 55 and the collector region 11. The power from an excess energy event is dissipated by diode 57 formed at the collector/base junction.

Although the present invention has been shown utilized in conjunction with a bipolar transistor, it may be used to protect any device. For example, in FIG. 8 the present invention is utilized to provide protection to a schottkey diode. The diode is formed in an n-collector region 11 formed on a p-type substrate 10 with a buried layer 38 formed at the collector/substrate interface. The metal contact is formed on the surface of the collector region 11 along with a guard base ring 54 which is p-type. Contact to the collector region 11 is also provided through n+ region 50 and metal contact 49. In this embodiment either the metal contact 48 or metal contact 49 will be coupled to a bonding pad, with the other contact coupled, for example, to ground. A base region 58 is formed overlapping the isolation region 12 and the collector region 11. A diode 52 is formed at the junction between the collector region 11 and the base region 58. The reverse breakdown voltage of this diode 52 must be lower than or equal to the reverse breakdown voltage of diode 53 formed at the junction of guard ring 54 and collector region 11.

Figure 8:
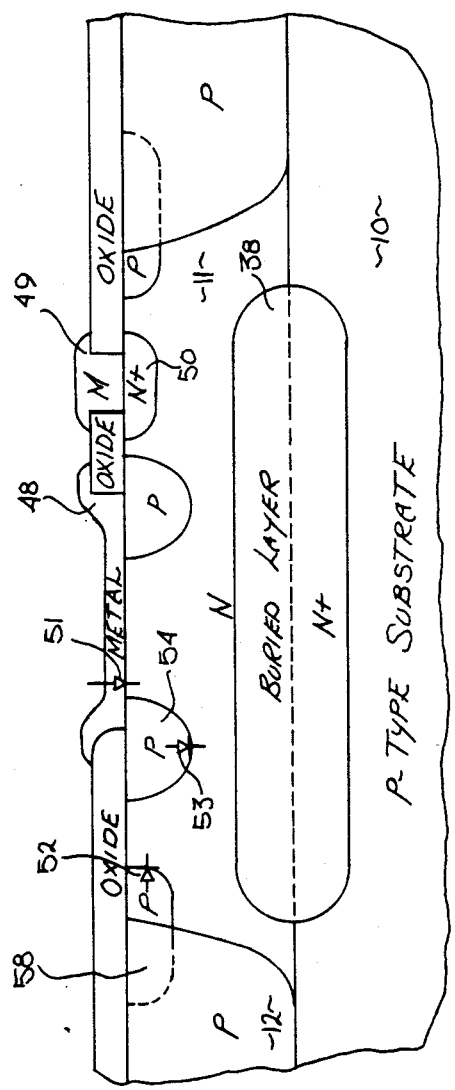
FIG. 8 illustrates the present invention in use with a schottkey diode.

The Schottky diode shown in FIG. 8 is a guard ring diode but the present invention can be adapted to operate equally effectively on a shottkey diode not employing a guard ring, as shown in FIG. 10. A diode 51 is formed at the junction between the metal contact 48 and the collector region 11, with the metal contact acting as the p-type portion. This diode typically breaks down in the range of approximately 7 volts, with breakdown occurring at the corners of the metal/oxide interface. This results in a high concentration of heat along the contact interface, causing thermal degradation of the diode. By adding an emitter region 58 overlapping the base region 58 and collector region 11, a diode 60 is formed having a lower reverse breakdown than diode 51. By employing the present invention, the power is dissipated at diode 60, dissipating a lower amount of power and protecting the contact 48 without the use of a guard ring.

Although the present invention has been described in conjunction with specific breakdown voltages, it will be obvious to one skilled in the art that the present invention may be practiced without reference to specific voltages. If the reverse breakdown voltage of the added base/collector junction is less than or equal to the isolation/collector breakdown and greater than the operating voltage of the protected device, the present invention will act to provide high energy event protection. The present invention can also be applied to other technologies, such as gallium arsenide or Silicon on Sapphire (SOS), or whenever isolation regions of one conductivity type are used with regions of a second conductivity type.

Thus, a novel circuit configuration has been described which provides protection for semiconductor devices against high energy events.

What is claimed is:

1. A semiconductor protection circuit comprising:
   a semiconductor substrate of a first conductivity type;
   a first semiconductor layer collector region disposed on said substrate, said first layer of a second conductivity type;
   an isolation region of said first conductivity type formed in said first layer;
   a transistor formed in said first layer, said transistor having a base region of said first conductivity type formed in said first layer and an emitter region disposed in said base region, said transistor having a conductive means coupled to said emitter region for coupling said transistor to a bonding pad;
   a first region of said first conductivity type formed in said first layer and extending partially into said isolation region, said first region and said isolation region each having a doping level, said first region having a doping level less than the doping level of said isolation region, said first region and said isolation region being disposed away from and isolated from said conductive means.

2. The circuit of claim 1 wherein said first conductivity type is p type.

3. The circuit of claim 2 further including an n+ region disposed at a surface of said first layer for providing a contact region to said first layer.

4. The circuit of claim 3 wherein said n+ region extends into said first region.

5. A semiconductor protection circuit comprising:
   a semiconductor substrate of a first conductivity type;
   a first semiconductor layer collector region disposed on said substrate, said first layer of a second conductivity type;
   an isolation region of said first conductivity type formed in said first layer, said isolation region having a first doping level;
   a first base region of said first conductivity type formed in said first layer and extending into said isolation region, said first base region having a second doping level less than said first doping level;
   a first emitter region of said second conductivity type formed in said first base region;
   a second base region of said first conductivity type formed in said first layer and away from the said first base region, said second base region having said second doping level and electrically coupled through a conductive layer to said first emitter region;
   said isolation region disposed away from said conductive layer;
   a second emitter region of said second conductivity type formed in said second base region;
   a third emitter region of said second conductivity type formed in said first layer and away from said second base region, said third emitter region electrically coupled to said second emitter region.

6. A semiconductor protection circuit comprising:
   a semiconductor substrate of a first conductivity type;
   a first semiconductor layer collector region disposed in said substrate, said first layer of a second conductivity type;
   a first region of said second conductivity type formed at a surface of said first layer, said first region of said second conductivity type electrically coupled to a bonding pad;
   an isolation region of said first conductivity type formed within said first layer and disposed away from and isolated from said bonding pad;
   a base region of said first conductivity type formed in said first layer, said base region superimposed upon and coextensive with said isolation region where said isolation region meets said surface of said first layer, said base region being more heavily doped than said isolation region;
   a buried layer of said second conductivity type formed at the interface of said substrate and first layer, said buried layer being more heavily doped than said second layer, said buried layer extending into said isolation region.

7. The circuit of claim 6 wherein said first conductivity type is p type.

8. A semiconductor protection circuit comprising:
   a semiconductor substrate of a first conductivity type;
   a firsts semiconductor layer disposed on said substrate, said first layer of a second conductivity type;
   an isolation region of said first conductivity type formed in said first layer;
   a Schottky diode formed in said first layer, said diode including conductive means for coupling said diode to a bonding pad, said diode having a guard ring of said first conductivity type formed at a surface of said first layer, a metal contact contacting said first layer and said guard ring, a region of said second conductivity type formed at said surface of said first layer and having a doping level greater than said first layer;
   a first region of said first conductivity type formed in said first layer and extending partially into said isolation region, said first region and said isolation region each having a doping level, said first region having a doping level less than the doping level of said isolation region, said first region and said isolation region being disposed away from and isolated from said conductive means; said first region surrounding and disposed away from said Schottky diode.

9. The circuit of claim 8 wherein said first conductivity type is p type.

* * * * *